US011508702B2

(12) United States Patent
Wu

(10) Patent No.: US 11,508,702 B2
(45) Date of Patent: Nov. 22, 2022

(54) INTEGRATED CONTROL LED DISPLAY SYSTEM

(71) Applicant: Shenzhen Chip Optech Co. Ltd., Shenzhen (CN)

(72) Inventor: XiaoGang Wu, Shenzhen (CN)

(73) Assignee: Shenzhen Chip Optech Co. Ltd., Shenzhen (CN)

(*) Notice: Subject to any disclaimer, the term of this patent is extended or adjusted under 35 U.S.C. 154(b) by 205 days.

(21) Appl. No.: 16/920,666

(22) Filed: Jul. 4, 2020

(65) Prior Publication Data

US 2021/0005798 A1 Jan. 7, 2021

(30) Foreign Application Priority Data

Jul. 4, 2019 (CN) .................. 201910597100.X

(51) Int. Cl.
*H01L 25/07* (2006.01)
*H01L 25/075* (2006.01)
*G09G 3/32* (2016.01)
*H01L 33/62* (2010.01)
*H01L 33/24* (2010.01)
*G09F 9/33* (2006.01)
*G09F 9/302* (2006.01)
*G06F 3/14* (2006.01)
*G09F 13/04* (2006.01)
*G06F 1/16* (2006.01)
*G06F 1/18* (2006.01)

(52) U.S. Cl.
CPC ........ *H01L 25/0753* (2013.01); *G06F 3/1446* (2013.01); *G09F 9/3026* (2013.01); *G09F 9/33* (2013.01); *G09F 13/0413* (2013.01); *G09G 3/32* (2013.01); *H01L 25/073* (2013.01); *H01L 33/24* (2013.01); *H01L 33/62* (2013.01); *G06F 1/1601* (2013.01); *G06F 1/182* (2013.01); *G09F 9/3023* (2013.01)

(58) Field of Classification Search
CPC ... H01L 25/0753; H01L 25/073; H01L 33/24; H01L 33/62; G06F 3/1446; G09F 9/3026; G09F 9/33; G09F 13/0413; G09F 9/3023; G09G 3/32
See application file for complete search history.

(56) References Cited

U.S. PATENT DOCUMENTS

| 11,119,721 | B1* | 9/2021 | Harris | .................. G07G 1/01 |
| 2014/0085864 | A1* | 3/2014 | Wu | .................. F21V 19/001 362/97.1 |
| 2014/0111992 | A1* | 4/2014 | Yeoh | .................. G09F 9/3023 257/E33.059 |
| 2014/0198251 | A1* | 7/2014 | Li | .................. G02F 1/13336 348/453 |

(Continued)

*Primary Examiner* — S M Sohel Imtiaz
(74) *Attorney, Agent, or Firm* — Novoclaims Patent Services LLC; Mei Lin Wong

(57) ABSTRACT

An integrated control LED display system, comprising a number of module screens (100) which are assembled together to form a large display screen, each of the module screens (100) comprises several unit screens (200), a splicing frame (300) and a control box (400), several unit screens (200) are assembled in the splicing frame (300) to form a said module screen (100), the control box (400) is arranged on the back of the module screen (100), and the control box (400) can simultaneously control the work mode of the unit screens (200).

2 Claims, 6 Drawing Sheets

(56) References Cited

U.S. PATENT DOCUMENTS

| | | | | |
|---|---|---|---|---|
| 2016/0348854 A1* | 12/2016 | Wu | ............................ | G09F 9/33 |
| 2018/0151096 A1* | 5/2018 | Hall | ................... | H05K 7/20127 |
| 2020/0035134 A1* | 1/2020 | Pahlevaninezhad | ........................ | H01R 13/6205 |
| 2020/0111391 A1* | 4/2020 | Chao | ..................... | G02B 6/4298 |
| 2020/0375039 A1* | 11/2020 | Mudd | ................... | H05K 5/0204 |
| 2021/0082884 A1* | 3/2021 | Schwarz | ............. | H01L 25/0753 |

* cited by examiner

INTEGRATED CONTROL LED DISPLAY SYSTEM

FIELD OF THE INVENTION

The invention relates to an LED display screen, in particular to an LED display system which is convenient for splicing. The LED display system includes several unit screens. When assembling, a certain number of the unit screens are assembled in a splicing frame to form a module screen. A number of the module screens are assembled horizontally or vertically to form a large display screen.

PRIOR ART

The LED display screen is a flat panel display assembled by several small LED modules, and is used to display text, images, videos and video signals.

At present, LED display screens have been widely used in many fields such as outdoor advertisement displaying and product image displaying.

In the specific use, the staff will generally assemble several small LED display screens together to form a large integrated display screen to display text, images, video and other information. This large integrated display screen can improve the size of the display screen so as to improve the effect of displaying and showing.

FIG. 1 is the main view of a large integrated display screen which is assembled by several display boxes 1.

As shown in FIG. 2, each of the display boxes 1 includes an outer frame 2, a plurality of modules 3, and a power box 4, wherein the modules 3 are installed on the outer frame 2, and the power box 4 is connected on the back of the display box 1. The power box 4 is used to set electronic components such as IC, PCB, and so ona. The modules 3 are fixedly connected to the power box 4 at the same time through circuit wires 5.

The above-mentioned conventional LED display screen still has the following disadvantages.

First, each small LED display needs to be provided with an outer frame 2 and a power supply box 4 individually to display, and the overall structure is very complicated.

Second, each small LED display needs to be provided with a separate connecting lock to realize the assembling between the display screens.

Third, because each small LED display screen has an independent power box 4, after assembling, different power boxes 4 need to be connected together by external lines (power lines, signal lines) to complete the overall power supply connection and signal connection, the circuit layout is very complicated, and the connection is very complicated.

SUMMARY OF THE INVENTION

The first object of the present invention is providing an integrated control LED display system, which forms a module screen (100) by several unit screens (200) of the same structure, and the module screens (100) are assembled together horizontally or vertically to form a large display screen. The assembling is simple, and is convenient for assembly and disassembly.

The second object of the present invention is providing an integrated control LED display system which integrates power supply control modules and signal control modules of a plurality of unit screens (200) constituting the module screen (100) in the control box (400), so as to greatly simplify the structure of the unit screen (200), standardize the unit screen (200), and facilitate separate assembly and disassembly. At the same time, the control box (400) realizes centralized setting of circuits and electronic components, centralized heat dissipation, centralized electromagnetic shielding, and centralized protection.

The third object of the present invention is providing an integrated control LED display system, which connects different control boxes (400) of the different module screens (100) by the lead-in cable (410) and the lead-out cable (420), so as to greatly simplify the connection Lines, and greatly reduce the difficulty of assembling wires.

An integrated control LED display system, comprising a number of module screens (100) which are assembled together to form a large display screen, each of the module screens (100) comprises several unit screens (200), a splicing frame (300) and a control box (400), several unit screens (200) are assembled in the splicing frame (300) to form a said module screen (100), the control box (400) is arranged on the back of the module screen (100), and the control box (400) can simultaneously control the work mode of the unit screens (200).

DETAILED DESCRIPTION OF THE INVENTION

As shown in FIGS. 3 to 7, an integrated control LED display system includes several module screens (100).

Figure 5:
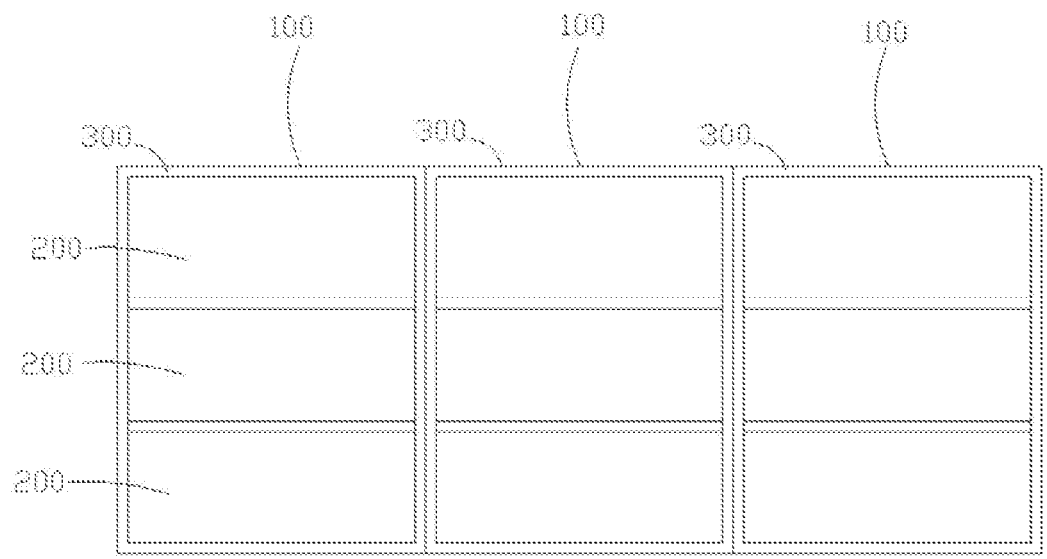
FIG. 5 is a schematic diagram of assembling the module screens of the present invention horizontally to form a large display screen.

As shown in FIG. 5, a number of the module screens (100) are assembled together to form a large display screen which can display information such as texts, images, and videos.

In specific implementation, the module screens (100) can be assembled together in various ways such as horizontal assembly and vertical assembly to form a large display screen.

Each module screen (100) includes several unit screens (200), a splicing frame (300) and a control box (400).

Several unit screens (200) are assembled in the splicing frame (300) to form a module screen (100).

The control box (400) is arranged on the back of the module screen (100), and the control box (400) can simultaneously control the work mode of several unit screens (200).

The specific description is that the control box (400) provides power supply for several unit screens (200), and the control box (400) simultaneously controls the lighting and image displaying methods of the unit screens (200).

Figure 6:
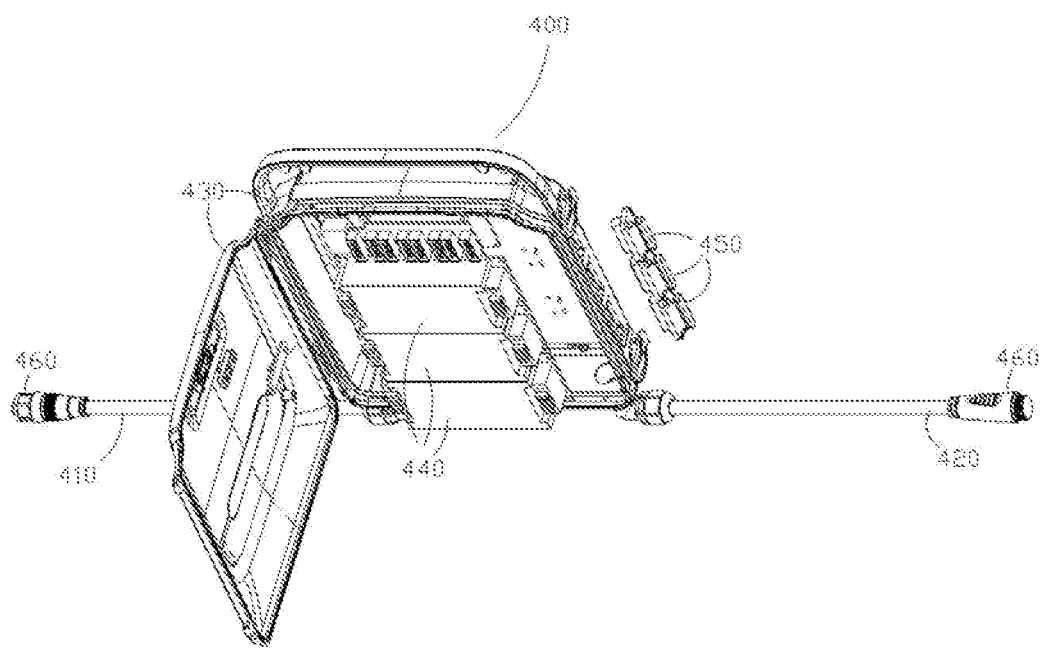
FIG. 6 is a perspective view of the collective power box of the present invention.

As shown in FIG. 6, the control box (400) includes a lead-in cable (410) and a lead-out cable (420).

Figure 7:
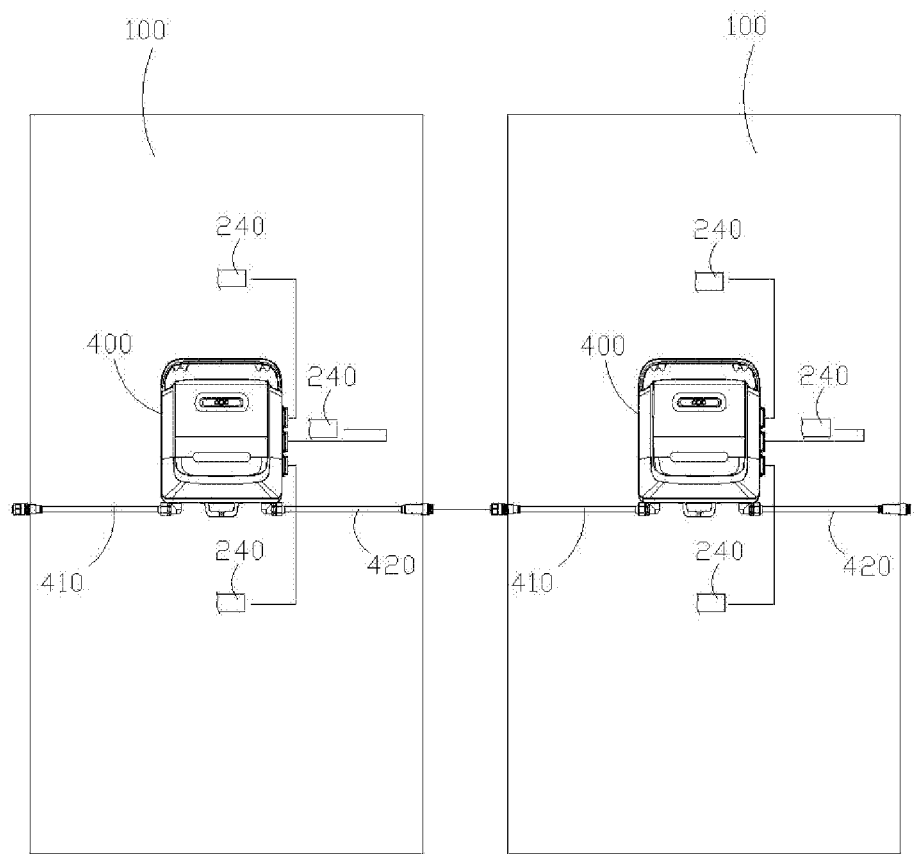
FIG. 7 is a schematic diagram of the connection of two module screens of the present invention.

As shown in FIG. 7, the lead-in cable (410) and the lead-out cable (420) are connected to the two sides of the box (430).

As shown in FIGS. 5 and 7, when several module screens (100) are assembled together horizontally or vertically to form the large display screen, the lead-in cable (410) and the lead-out cable (420) are connected to different module screens (100).

The control boxes (400) of different module screens (100) are connected together by the lead-in cable (410) and the lead-out cable (420).

Both the lead-in cable (410) and the lead-out cable (420) are integrated with power lines and signal lines.

In a specific implementation, the ends of the lead-in cable (410) and the lead-out cable (420) are provided with plugs (460) to facilitate connection.

When a plurality of the module screens (100) are assembled together horizontally or vertically to form the large display screen, the lead-out cable (420) of one module screen (100) is connected with the lead-in cable (410) of another module screen (100) so as to connect the control boxes (400) of different module screens (100) together.

Firstly, according to the present invention, a plurality of the unit screens (200) of the same structure are connected to form the module screen (100), and then a plurality of the module screens (100) are assembled horizontally or vertically to form the large display screen. The assembling is simple, and is convenient for assembly and disassembly.

In addition, according to the present invention, a plurality of power control modules and signal control modules of the unit screens (200) constituting the module screen (100) are centrally arranged in the control box (400), so as to greatly simplify the structure of the unit screen (200), standardize the unit screen (200), and facilitate separate assembly and disassembly. At the same time, the control box (400) realizes centralized setting of circuits and electronic components, centralized heat dissipation, centralized electromagnetic shielding, and centralized protection.

Finally, according to the present invention, the control boxes (400) of different module screens (100) are connected together by the lead-in cable (410) and the lead-out cable (420), so as to greatly simplify the connection Lines, and greatly reduce the difficulty of assembling wires.

In the specific implementation, the control box (400) further includes a box body (430), an element module (440), and several connection sockets (450).

Wherein the element module (440) is arranged in the box body (430), the element module (440) includes a power control module and a signal control module.

Several connection sockets (450) are provided on the box body (430), and the number of the connection sockets (450) is equal to the number of the unit screens (200) constituting the module screen (100), for example, if the module screen (100) is formed by three unit screens (200), the box body (430) is provided with three connection sockets (450).

Each unit screen (200) is provided with a lead-out wire (240).

The connection sockets (450) and the lead-out wires (240) of the unit screens (200) constituting the module screen (100) are in one-to-one correspondence. The lead-out wire (240) is correspondingly plugged into the connection socket (450).

In specific implementation, each unit screen (200) is provided with a fixed lock (250) which can fix the unit screen (200) on the splicing frame (300).

Figure 4:
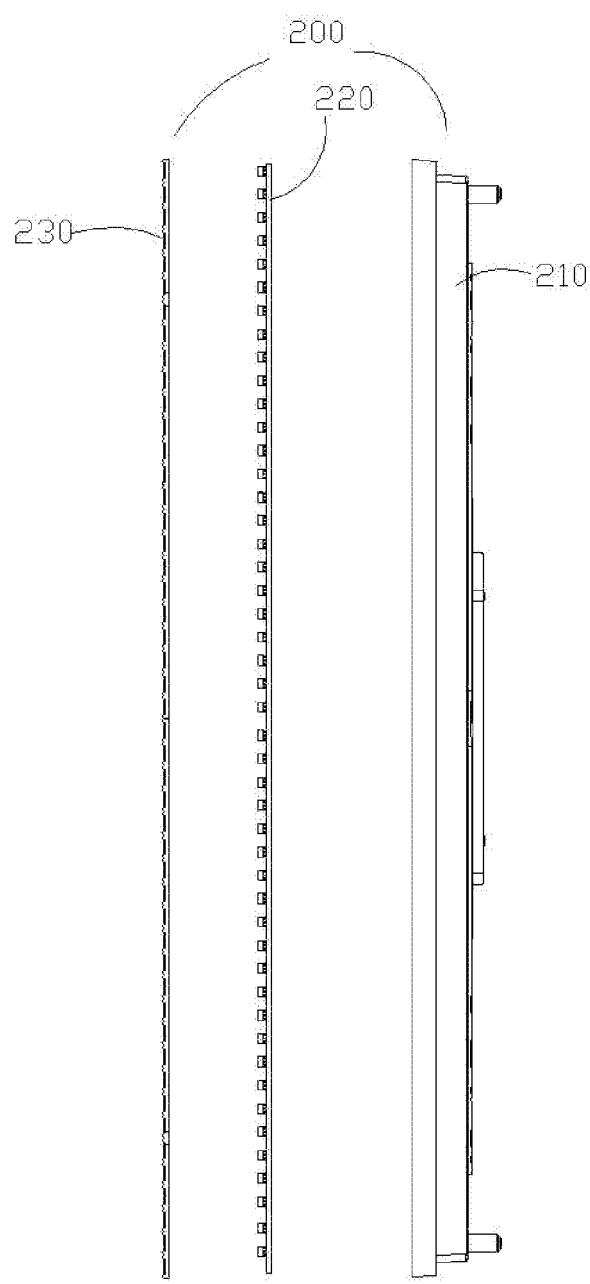
FIG. 4 is a schematic diagram of a unit screen of the present invention.

As shown in FIG. 4, each unit screen (200) includes a bottom plate (210), an LED lamp board (220), and a cage (230).

Figure 1:
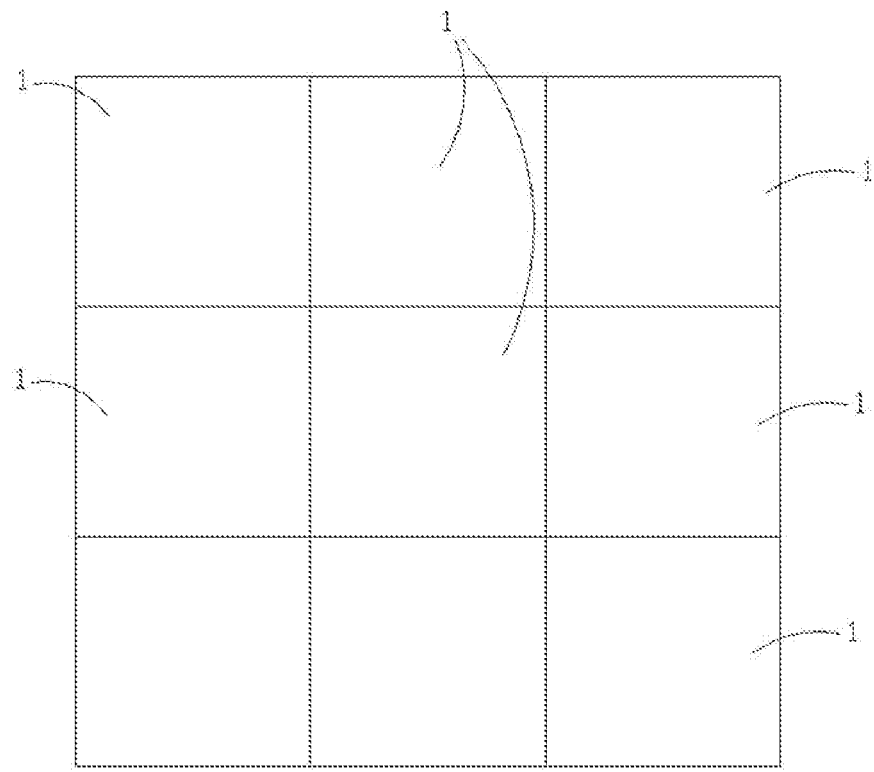
FIG. 1 is a schematic diagram of assembling several small LED display screens into a large display screen in the conventional technology.
Figure 2:
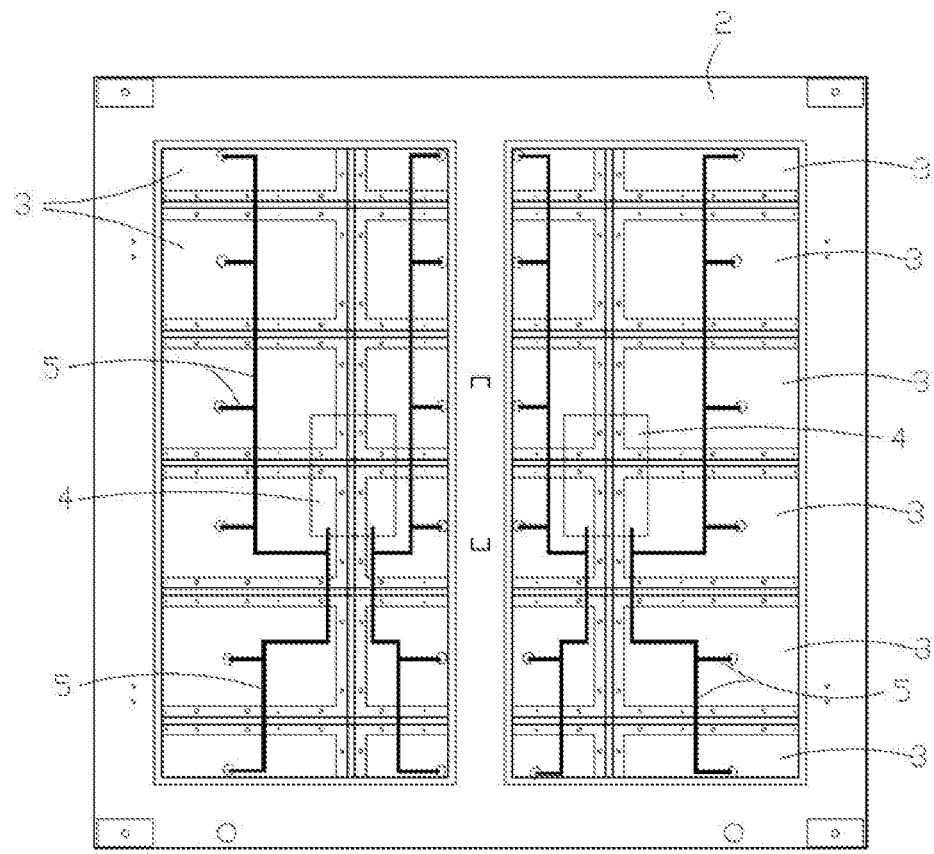
FIG. 2 is a schematic diagram of the back of a conventional small LED display screen.
Figure 3:
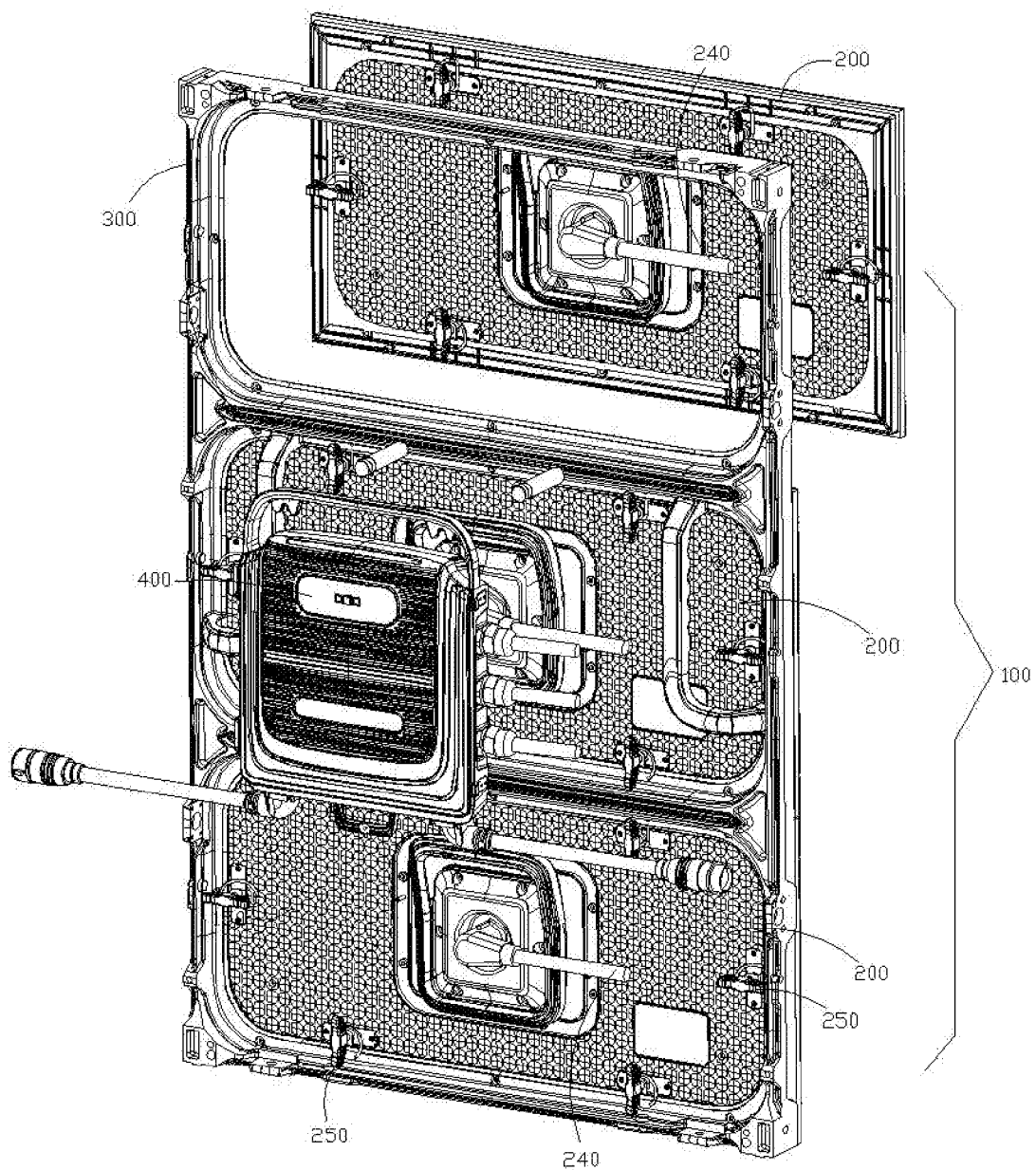
FIG. 3 is a perspective view of the module screen of the present invention.

As shown in FIG. 3, each unit screen (200) is connected with a lead-out wire (240) on the back.

The bottom plate (210), the LED lamp board (220) and the cage (230) are all plate-shaped.

The LED lamp board (220) is fixed on the bottom plate (210), and the cage (230) is arranged in the front of the LED lamp board (220).

The unit screen (200) is in flat shape.

The lead-out wire (240) is connected with the LED lamp board (220) of the unit screen (200).

The power lines and the signal lines are integrated in the lead-out wire (240).

The lead-out wire (240) is used to supply power to the LED lamp board (220) of the unit screen (200), and transmit various signals to the LED lamp board (220) of the unit screen (200), such as control signals, data signals, etc.

In specific implementation, the LED lamp board (220) may be spliced by multiple LED lamp boards.

What is claimed is:

1. An integrated control LED display system, comprising a number of module screens (100) which are assembled together to form a large display screen, each of the module screens (100) comprises several unit screens (200), a splicing frame (300) and a control box (400), several unit screens (200) are assembled in the splicing frame (300) to form one said module screen (100) of said number of module screens (100), the control box (400) is arranged on the back of the module screen (100), and the control box (400) can simultaneously control the work mode of the unit screens (200), wherein the control box (400) comprises a lead-in cable (410) and a lead-out cable (420), when several module screens (100) are assembled together to form the large display screen, the lead-in cable (410) and the lead-out cable (420) are connected between different module screens (100), the control boxes (400) of different module screens (100) are connected together by the lead-in cable (410) and the lead-out cable (420), wherein the control box (400) further comprises a box body (430), a element module (440) and several connection sockets (450), wherein the element module (440) is arranged in the box body (430), a number of the connection sockets (450) are provided on the box body (430), and the number of the connection sockets (450) is equal to the number of the unit screens (200) constituting the module screen (100), each unit screen (200) is provided with a lead-out wire (240), the connection sockets (450) and the lead-out wires (240) of the unit screens (200) constituting the module screen (100) are in one-to-one correspondence, the lead-out wires (240) are correspondingly plugged into the connection sockets (450).

2. An integrated control LED display system according to claim 1, wherein the element module (440) comprises a power control module and a signal control module.

* * * * *